SEMICONDUCTOR INTEGRATED CIRCUIT DEVICE

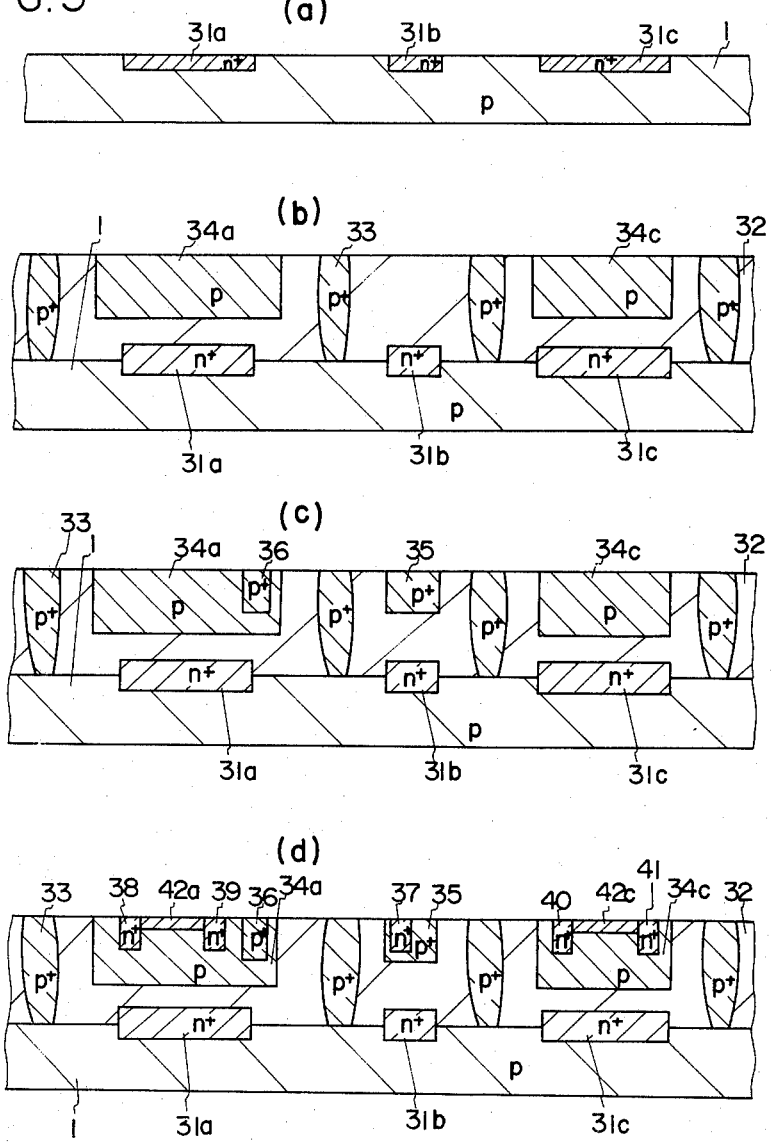

BACKGROUND OF THE INVENTION

1. Field of the Invention

The present invention relates to the structure of a semiconductor integrated circuit, wherein a junction-type field effect transistor and a bipolar semiconductor device are formed on a single monolithic semiconductor substrate.

2. Prior Art

In a junction-type field effect transistor (hereinafter referred to J-FET) the drain current is proportional to the square of the gate voltage. In a bipolar transistor, however, collector current is exponentially proportional to base voltage. The J-FET is now used in numerous fields such as audio instrumentation. Recently, it has become necessary to form a J-FET and a bipolar transistor on a single monolithic substrate to make an integrated circuit (IC). Several attempts are now being tried to realize this kind of IC.

The merits of these attempts are as follows:
(i) the input impedance can be raised by introducing the J-FET in the IC,
(ii) the input impedance of the J-FET is high and therefore amplification of the first stage of an audio amplifier is made without producing noise,
(iii) it is possible to increase the degree of freedom for circuit design, reducing the number of parts for low noise and a high integration density,
(iv) the required chip area and costs can be reduced as compared to a J-FET used independently from the IC, and noise generated at interconnection means etc. can be reduced.

Conventionally, only p-channel type J-FETs are used to make the IC, which comprises both the J-FET and the bipolar transistor on the single substrate, and such IC's are developed mainly for operational amplifiers. This is because an n-channel type J-FET is difficult to fabricate due to an increase of the fabrication process steps (thermal diffusion process steps). The noise characteristics of the n-channel type J-FET are not good as to be described later. Also a p-channel type J-FET can be used in an operational amplifier, for which both a positive with a negative power sources are available and the source of the p-channel type J-FET connected to the negative power source (since for a p-channel type J-FET, the gate is positive against the source).

For a usual top gate type J-FET, where a gate diffusion region is formed in an epitaxially grown layer, its channel thickness is determined by the difference between the thickness of the epitaxial layer and diffusion depth of a gate diffusion region, and this difference must be controlled very precisely.

On the other hand, the base thickness of a bipolar transistor in an IC is determined by the time period of the thermal treatment for diffusion for a base region and an emitter region (since the base thickness is the difference of depths between both diffused regions). The allotment of these time periods delicately determines the base thickness giving rise to a suitable value of current amplification factor $h_{fe}$. Accordingly, the precise control for the channel thickness of the J-FET can not be coexistent with the thermal treatment condition since the channel thickness usually changes during the thermal treatment. It is therefore quite difficult to make the IC containing both a J-FET and a bipolar transistor in a single substrate.

When forming the J-FET together with the bipolar transistor in the IC, the construction with a back gate structure shown in FIG. 1 has been employed. FIG. 1 shows a p-channel type J-FET which is conventionally formed in an integrated circuit together with a bipolar transistor. That is, the J-FET with a surface channel and of the back gate structure is employed for the IC, since, in the fabrication process comprising such J-FET, it is possible to form a channel region without using thermal treatment of such high temperature as to change the base thickness of the bipolar transistor and therefore it is possible to obtain stable DC characteristics.

FIG. 1 shows a general structure of the back gate type J-FET. A back gate region 2 of an n-type epitaxial layer having a bulk resistivity of 1–3Ω. cm is formed on a p-type substrate 1. A source region 3 and a drain region 4 of p+-type diffused regions are simultaneously formed with forming of a base region of a bipolar transistor (not shown in FIG. 1) which is also formed in the n-type epitaxial layer 2. An n+-type diffused gate contact region 5 is also formed in the n-type epitaxial layer 2. A p-type channel region 6 of a low concentration is formed so as to have a precise depth by an ion implantation through the upper surface of the epitaxial layer 2. A thermally grown oxide film 7 and metal electrodes $8_S$, $8_D$ and $8_G$ for the source 3, the drain 4 and the gate 5, respectively are formed on specified parts of the substrate as shown in FIG. 1.

Operation of this J-FET is based on the function that conductance of the channel region 6 is controlled by a voltage applied to the gate region 2. Namely, the conductance control is made by impressing a bias voltage through the gate electrode $8_G$ to a part of the back gate region 2 which is under the channel region 6.

Since the channel region 6 of this kind J-FET is formed at the surface, the thickness and the impurity concentration of the channel region 6 are not strongly affected by the thickness and the impurity concentration of the epitaxial layer 2. This is a merit for the manufacturing and they are determined almost solely by an amount of impurities doped through the surface. Therefore, the channel region 6 of a low resistivity value can be precisely formed by, for example, the ion implantation.

But the device shown in FIG. 1 has the following significant shortcomings. Since carriers running in the channel region 6 are controlled by the gate bias voltage given from the bottom of the channel region 6, the carriers run only near the surface of the channel region 6, resulting in noise troubles. This is attributed to several noise causes such as recombination and generation of charges by the surface states at the interface between the oxide film 7 and the channel region 6, and defects at the surface due to distortions made during processing.

In order to overcome these shortcomings, several alteration can be made to prevent the carriers from running at the surface of the channel region 6.

For example, FIG. 2 shows a J-FET, wherein an electrode 8ch for applying voltage is formed on a thermally grown oxide film 7 at the surface of a channel region 6. Electrode 8ch, can create electrically an inversion region 9 at the surface of channel region 6 thereby preventing carriers from flowing at the interface of the channel region 6 and the thermally grown oxide film 7, thereby to reduce reciprocal—frequency (1/f) noise.

the surface channel region 19. Thus the noise is produced by the surface states. In FIG. 4, which shows relations between the equivalent input voltage $e_n$ (nV/$\sqrt{Hz}$) and frequency, the other curve II shows the noise characteristic of the p-channel FET shown in FIG. 2. As is apparent from a comparison of the curves I and II of FIG. 4, even though having a MOS gate, the n-channel type IC (curve I) of FIG. 3 has poorer noise characteristic than that of the p-channel type (curve II), especially in the low frequency range. The reason for this is not clear theoretically, but may be related to the kinds of carriers in the channel. Thus, surface channel J-FETS have poor noise characteristics.

Furthermore, if the n-channel J-FET part NCHFT of the IC of FIG. 3 has a low pinch off voltage $V_p$ of about IV, then at application of a voltage of about the value $V_p$ to the resistor part RST, the resistor part saturates, instead of having an ohmic linear characteristic such a saturated non-linear characteristic at the application of such a low voltage is an adverse characteristic which limits the utility of the IC. On the other hand, if resistor part RST of the IC of FIG. 3 is made to have a high saturation voltage by making the depth of the diffused regions 19 and 20 to be over 4 μm and the sheet resistance of the diffused regions to be several KΩ, then the saturation point of voltage-current characteristic of the resistor part RST can be much improved but the pinch off voltage $V_p$ of the J-FET part NCHFT becomes extraordinary high thereby making the performance of the J-FET poor. Also the carriers will flow at the substrate surface part raising the reciprocal frequency noise.

Other types of resistors can be made in the ICs simultaneously with forming of the base region or the emitter region. But the sheet resistance of these regions range from 10 Ω to 300 Ω, and therefore, the resistance obtained is not sufficient. A squeeze resistor, which is made by utilizing a depletion layer of the base formed between the emitter and the base, can be of high resistance. However, the squeeze resistor has poor ohmic linearity and a low breakdown voltage $V_{CEO}$ of about 5 to 6 V, since the impurity concentration of the base region is high.

As has been elucidated, as a result of the abovementioned research through several possibilities of the conceived construction, the inventors found that, (1) in order to decrease scattering of the DC characteristics, the depth of the channel and the depth of the gate region should be made small, (2) the noise, especially 1/f noise, becomes large when the carriers move at the surface part and (3) even if a MOS gate is provided, a high voltage is necessary. Furthermore, in order to obtain a FET in an IC comprising a combination of bipolar device(s) and J-FET(s) with stable DC characteristics, a back gate type construction is necessary, because high manufacturing temperatures are unnecessary; but this back-gate type device has poor noise characteristics, especially of large 1/f noise, and moreover, it is difficult to obtain an IC with a resistor part of good ohmic characteristic required for use in audio appliances and the like.

SUMMARY OF THE INVENTION

The present invention provides an IC with a J-FET and a bipolar semiconductor device therein, wherein both the J-FET and the bipolar device have satisfactory characteristics. Particularly the transistors have satisfactory low noise, good DC characteristics and a satisfactory pinch off voltage, and the resistor simultaneously has satisfactory ohmic characteristics for a considerable large voltage as a result of adopting a novel construction.

DETAILED DESCRIPTION OF THE INVENTION

Figure 1:
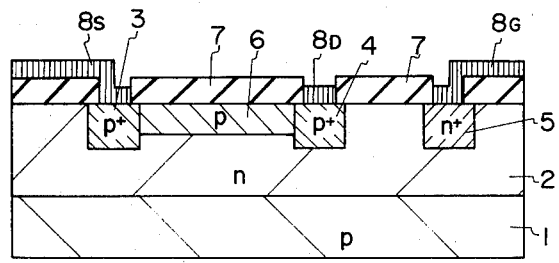
FIG. 1 and FIG. 2 are sectional elevation views of back gate type J-FETs.

In order to obtain an IC device capable of fulfilling the abovementioned object of the invention, an impurity doped surface region of same conductivity type as that of a gate region is formed on the surface of a channel region situated at the surface of the J-FET substrate. By making this doped surface region extremely thin and isolated from the drain region of the J-FET, it is possible to reduce input noise equivalent voltage and to form an ohmic resistor of large value together with a bipolar transistor on a monolithic substrate.

In accordance with one embodiment of the present invention, steps of fabrication process of an IC, having both n-channel type J-FET and bipolar transistor are elucidated referring to FIG. 5(a)–FIG. 5(f).

As shown in FIG. 5(a), n+-type buried diffusion layers 31a, 31b and 31c are formed by diffusing As or Sb as impurities on a p-type silicon wafer substrate surface, (111) surface orientation and 1–10 Ω.cm resistivity.

An n-type epitaxial layer 32 of 0.5–3 Ω.cm resistivity is then epitaxially grown onto substrate 1 by a known method using $SiCl_4$. A diffusion from a diffusion source of $BBr_3$ or $BCl_3$ is made to form p+-type isolation regions 33 thereby dividing the epitaxial layer 32 into island regions. The isolation regions 33 are formed by two steps—a first step of diffusing impurities of a high concentration near the surface parts and then a second step of further diffusing the impurities by thermal treatment into deeper regions. During the second step, while the impurities are diffused into deeper regions to form the isolation regions 33, p-type wells 34a and 34c are simultaneously formed by diffusing impurities. The p-type wells 34a and 34c are used for a back gate region of the J-FET JF and for a resistor region of the resistor part RST, respectively. The selective doping process in the first step for the isolation regions 33 can be made by either of usual thermal diffusion or ion implantation. But it is necessary to form the isolation regions 33 in the regions deeper than the wells 34a and 34c, and the ion implantation method is therefore not applicable for the second step. The resistivity of the wells 34a and 34c is 0.5 to several $\Omega \cdot$cm and the diffusion depth thereof is about 5 $\mu$m as shown by FIG. 5(b).

A p$^+$-type base region 35 to become an n-p-n bipolar transistor part BPTR and a p$^{30}$-type gate contact region 36 of low resistivity for the n-channel type J-FET part JF are simultaneously formed in the p-type well 34a and the epitaxial layer 32, respectively, by carrying out a selective diffusion from a boron source such as BBr$_3$, BCl$_3$ and B$_2$O$_3$ as shown by FIG. 5(c).

Then a selective simultaneous diffusion from a phosphor source such as POCl$_3$ and P$_2$O$_5$ is made to selectively form an n$^+$-type emitter region 37 in the base region 35, and n$^+$-type source and drain regions 38 and 39 in the p-type well 34a of the J-FET Part JF, and further n$^+$-type contact parts 40 and 41 of the resistor part RST in the p-type well 34c at the depth of 1.3–2.0 $\mu$m. This diffusion process is carried out by two stages—phosphorus of a high concentration is at first selectively diffused to a slight depth and then as a second stage thermal treatment is made at a specified temperature. After the first shallow diffusion ends, in order to form the surface channel region 42a and the resistor region 42c, phosphorus is doped with a low concentration by a thermal diffusion method or by an ion implantation with energy of 100–150 KeV into places scheduled to become the surface channel region 42a of the J-FET part JF and the resistor region 42c of the resistor part RST. Simultaneously with the abovementioned stage for forming the diffused regions 37, 38, 39, 40 and 41, the n-type channel region 42a of low resistivity and with the depth of 0.4–1.0 $\mu$m is formed between the source region 38 and the drain region 39 and the n-type resistor region 42c of the same impurity concentration and with the same depth is formed between the contact regions 40 and 41 as shown in FIG. 5(d).

Then an impurity-doped region 43 of a high concentration is formed as an inversion layer for blocking surface current. The inversion layer is a distinct feature of the present invention. This region 43 is p-type, which is opposite to the channel region 42a, and is an extremely thin layer of 500 Å–3,000 Å. The inversion layer 43 is formed by diffusing p-type boron impurities, by a thermal diffusion method, a doped oxide method or a doped polycrystal silicon method. The surface impurity concentration of the inversion layer has a high value of 10$^{19}$–10$^{21}$ atoms/cm$^3$, and the layer is formed isolated at least from the drain region 39 (in FIG. 5(e) it is separated from both the source region 38 and drain region 39).

Figure 8:
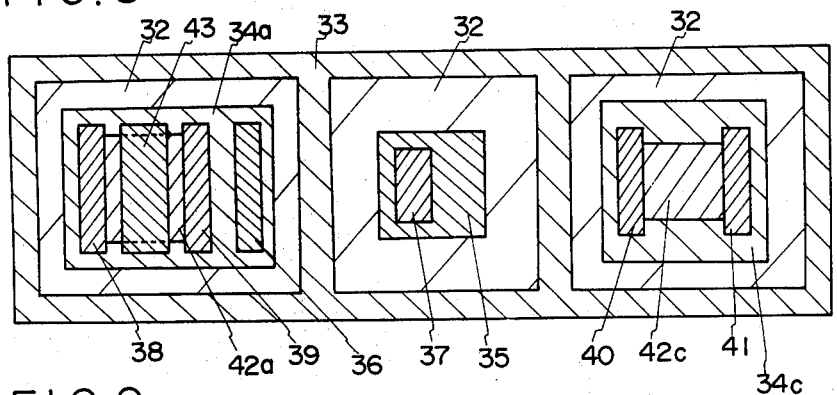
FIG. 8 is a top view of a modified example of the J-FET of FIG. 5.

As described below, the inversion layer 43 can extend to the well 34a (as shown in FIG. 8).

And finally, an insulating film 44 such as SiO$_2$, Al$_2$O$_3$, etc. is formed according to usual integrated circuit techniques. By opening specified parts thereof a source electrode 45, a drain electrode 46, a gate electrode 47, an emitter electrode 48, a base electrode 49, and resistor electrodes 50 and 51 are formed thereby completing the IC shown in FIG. 5(f). Metal gate electrodes 52 and 53 are disposed above the channel region 42a and the resistor region 42c through thin insulating films 54a and 54c, respectively. It is especially preferable to employ Al$_2$O$_3$ as an insulating film material, since it contains negative charges therein so that a low negative gate voltage is sufficient.

A pinch off voltage $V_P$ for such a structure of about 10–30 V is obtained for the resistor region 42c, that is, the resistor does not saturate at the 5 V, which voltage the IC is driven. It is a sufficiently practical circuit element having a high sheet resistance value of 200 $\Omega$–1K$\Omega$. Furthermore resistor part RST has superior linearity. The electrode 53 on the resistor part 42c is used by applying a potential thereto to prevent instability such as caused by the creep phenomenon for breakdown voltage (variation of breakdown voltage caused by the induction of charges into the oxide insulating film 54c as a result of a reaction with the diffused region). The electrode 53 further prevents resistance variation due to the induction of charges in the insulating film 54c caused by the surrounding atmosphere, thereby improving the stability of the resistor.

For the n-p-n bipolar transistor of FIG. 5(f), $h_{fe} = 90 \pm 20$, $V_{CBO} \simeq 60$ V and $V_{CEO} \simeq 25$ V, are obtained. For the J-FET a high $V_P$ value is not desirable. If the J-FET does not comprise the surface impurity doped region 43 and if the resistor region 42c and the channel region 42a are formed at a specified depth suitable for obtaining high $V_P$ for the resistor, then $V_P$ for the J-FET accordingly becomes high.

The present invention is characterized in that the surface impurity doped region 43 of high concentration is formed to obtain relatively uniform and quite small $V_P$ of $0.9 \pm 0.2$ V. The small pinch off voltage $V_P$ can be realized since channel region 42a is largely controlled by the surface region 43. The surface region 43 is extremely shallow, of 500 Å–3,000 Å (0.05 $\mu$m–0.3 $\mu$m) thickness as compared to the channel region 42a of 0.5–1.0 $\mu$m thickness. This is elucidated by FIg. 6, wherein a part of the surface region 43 of FIG. 5(f) is illustrated. In this case while the thickness of the channel region 42a is 0.6 $\mu$m, that of the surface region 43 is 0.1 $\mu$m and that of the depletion layers by the gate voltage spreading into the channel region 42a is 0.2 $\mu$m (the spreads are shown by broken lines in FIG. 6).

As shown the depletion layers spread both from the bottom of the surface region 43 and the bottom of the channel region 42a, by 0.2 $\mu$m, thus making the channel thickness 0.1 $\mu$m. This channel thickness is thinner than the channel thickness of 0.4 $\mu$m for the conventional back gate type J-FET. Accordingly, the pinch off voltage can be reduced by improving the control performance of the channel region 42a as a result of the formation of the thin surface region 43 in the shallow channel region 42a. Therefore it turns out that a big control effect for the channel can be obtained by the surface region 43 for the shallow channel region 42a of the back gate type J-FET. The formation of such shallow surface region 43 in the surface channel region 42a is a distinct aspect of the present invention.

Furthermore the J-FET operates with little noise and with less distribution of the channel characteristics. Carriers in the channel region 42a do not flow near the surface of the channel region 42a due to blocking by the surface region 43 thereby reducing the noise generated by the carriers flowing near the surface of the channel region 42a. The number of the carriers flowing near the surface of the channel region 42a becomes much smaller than that of the carriers flowing under the surface region 43 thus generating little noise. In the embodiments of the present invention, since the surface region 43 is isolated from the source 38 and the drain 39 (FIG. 5, FIG. 13 and FIG. 14) or is isolated from a drain region 39 (FIG. 15), the breakdown voltage between the source 38 and the drain 39 is not lowered.

In addition, the surfce region 43 is shallowly formed in such a manner that the doping does not affect the thickness of the channel region 42a. Therefore the channel characteristics of the J-FEt are solely determined by the dose amount of the ion implantation in a process for the formation of the channel region 42a and the thickness, the impurity concentration and a pattern size of the channel region 42a are precisely controllable thereby reducing the variation of the DC characteristics in a single lot.

Figure 5:
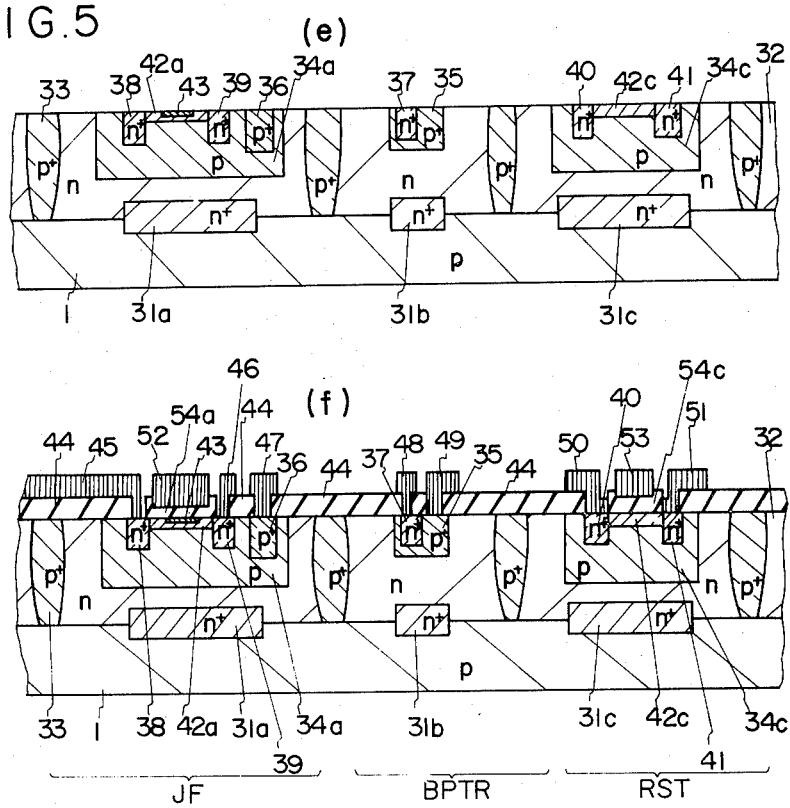
FIG. 5(a) to FIG. 5(f) are sectional elevation views showing fabrication process of an IC comprising an n-channel type J-FET in accordance with one embodiment of the present invention.
Figure 6:
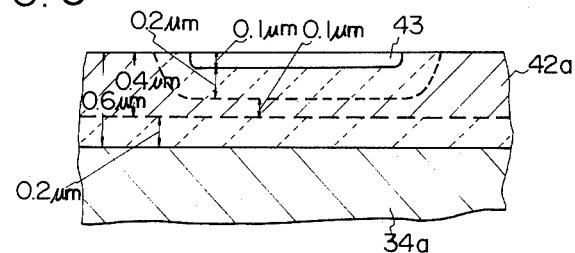
FIG. 6 is an enlarged sectional elevation view of the J-FET of FIG. 5.

Moreover, for the J-FET of FIG. 5(f) the metal gate electrode 52 of a MOS structure is formed. When zero volts or the lowest voltage of a power source is applied to the metal gate electrode 52, minority carriers (holes, in case of the device of FIG. 5) are accumulated around the surface region 43 in the channel region 42a. Thus a p-type inversion layer is formed and hence the carrier-flowing region is pushed into the bulk inside the substrate, thus further reducing the surface noise effect at the surface of the channell region 42a.

Figure 2:
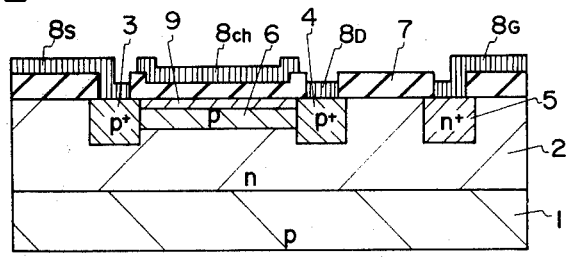
Figure 3:
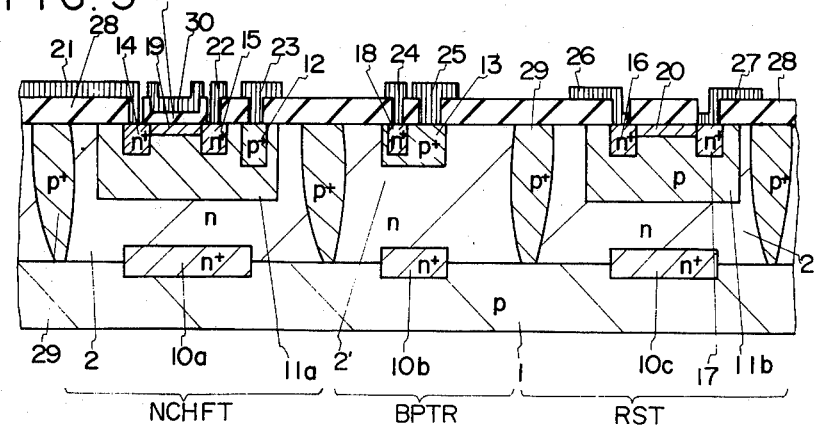
FIG. 3 is a sectional elevation view of a part of an IC comprising an n-channel type J-FET, a bipolar transistor and a resistor, the construction of this IC being conceived by the inventors preceding to the present invention but not disclosed yet.

There are great differences between the J-FET of the embodiment of the present invention and the devices with the gate electrodes of MOS structure shown in FIG. 2 and FIG. 3. In the device of FIG. 3, a p-type inversion layer is obtainable only when applying a high negative voltage to the electrode 30 and the effect of the electrode 30 is not at all operable when only a positive power source is available.

On the contrary, in accordance with the present invention the minority carriers (holes in case of the device of FIG. 5) are supplied by the p-type region 43, and a p-type inversion layer (not shown) immediately under the substrate surface can be easily formed around the surface region 43 in the channel region 42a. The inversion layer is formed between the surface region 43 and the source 38, and between the surface region 43 and the drain 39, only by applying OV or the lowest voltage of the power source to the metal film 52. The inversion layer functions to isolate the carrier flow between the channel region and the drain or source region from the interface between the insulating film 54a and the channel region 42a, thereby reducing the surface noise generated at the interface of the silicon substrate and the insulating film.

Figure 7:
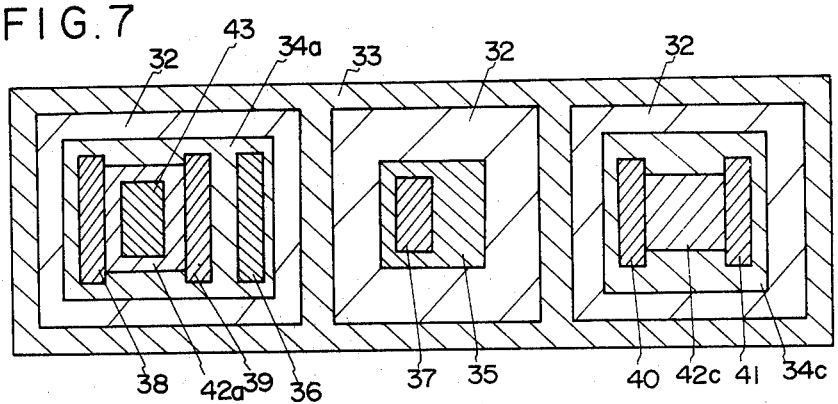
FIG. 7 is a top view of the J-FET of FIG. 5.

FIG. 7 and FIG. 8 show top views of IC's corresponding to the one in FIG. 5. Oxide insulating films and metal electrodes are omitted from these views. FIG. 8 is different from FIG. 7 in that an impurity doped surface region 43 is connected with a gate region 34a. In this device of FIG. 8, the surface region 43 also serves as a gate, thus producing a depletion layer and lowering the pinch off voltage. And for the IC device in FIG. 8, when there is a possibility that the $V_P$ becomes too low, it is necessary to form a channel region 42a at a deep depth in order to prevent the lowering of $V_P$ due to the spread of the depletion layer.

Figures of merit for noise for three IC devices are compared. They are (1) the n-channel type J-FET of FIG. 5(f), (2) its modified one excluding the metal gate electrode 52 (these two devices are made in accordance with the present invention), and (3) the J-FET of FIG. 3 which has no surface region like the region 43 of FIG. 5.

Figure 9:
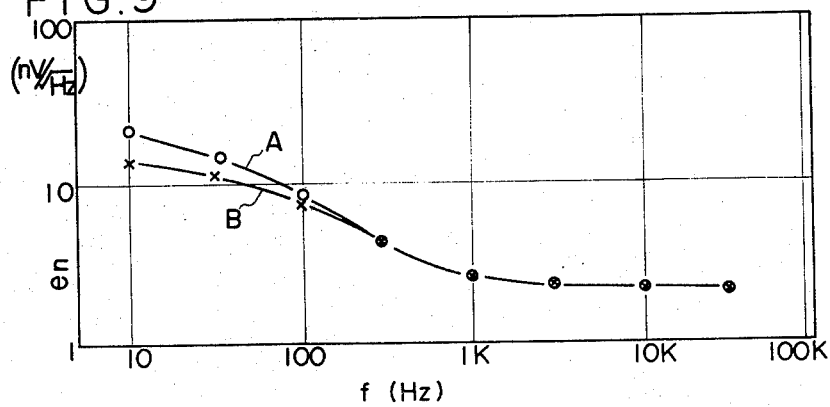
FIG. 9 is a noise characteristics diagram showing frequency spectral distribution of noises of J-FETs in accordance with the present invention.

FIG. 9 shows noise characteristic curves for the embodiments of the n-channel type of the present invention. In this case channel length is 10 μm, width 5 μm, depth 0.6 μm, depth of the surface region 43 0.1 μm and distance between the drain 39 and the surface region 43 2.5 μm, respectively, and voltage of OV is applied to the metal gate film 52. In FIG. 9 curve A is a measurement result for the J-FET device having no metal gate film 52 and a curve B is for the J-FET device having the metal gate film 52. A voltage same as that to the source is applied to the metal gate film 52. It is shown in the figure that noise performance for the J-FET device having the metal gate electrode film 52 is much improved in the lower frequency range.

Figure 4:
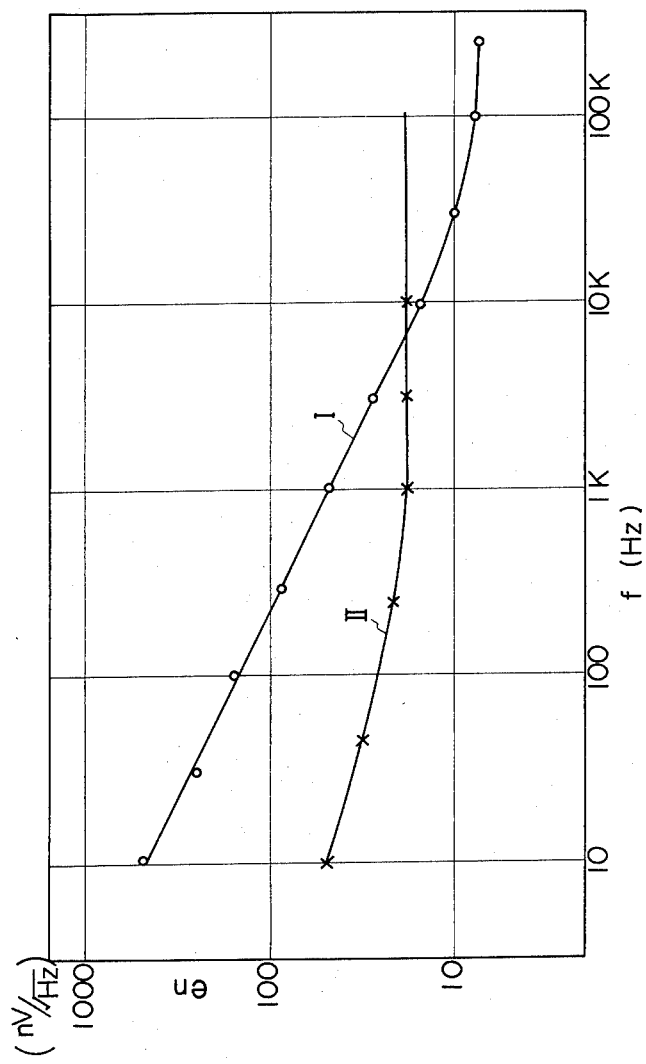
FIG. 4 is a characteristics diagram showing frequency spectral distribution of noises of J-FET devices of FIG. 2 and FIG. 3.

It is clearly shown comparing FIG. 9 and FIG. 4, that the noise performance is largely improved by forming surface region 43. As has been described above, the curves of FIG. 4 are obtained for the n-channel type J-FET of FIG. 3 (curve I) and the p-channel type J-FET of FIG. 2 (curve II). The J-FET of FIG. 3 does not have the surface region like that of 43 of FIG. 5(f) and is manufactured in the same manner for the device of FIG. 5 except for the surface region 43.

The 1/f noise caused by the carrier fluctuation of the carriers near the channel surface is largely reduced owing to the surface region 43 and the metal gate electrode 52. The 1/f noise amounts to at most 10-20 nV/√Hz at 10 Hz and is largely reduced compared to the J-Fet device having no surface region 43. Noise performance at several KHz frequency is also satisfactory amounting to 2–3 nV/√Hz Noise performance for the J-FET of FIG. 3 is revealed to be bad, since it has no surface region 43 and the inversion layer is formed only after sufficient high voltage is applied to the electrode 30.

On the other hand, the J-FET in accordance with the present invention has the surface region 43 of the opposite conductivity type to the channel region 42a and therefore the minority carriers for the channel region 42a are supplied from the surface region 43. Therefore, it is possible to form the inversion layer around the surface region 43 at the channel surface, only by application of such low voltage of OV to the electrode 52. This easy formation of the inversion layer all over the surface of the surface channel region gives rise to preferable results. Moreover, by providing the electrode 52 it is possible to prevent the creeping phenomenon (fluctuation of the breakdown voltage of the p-n junction) caused by the surface states at the surface of the channel region 42a between the surface region 43 and the drain 39.

Experimental data have been taken for similar J-FET devices by changing the thickness of the surface region 43 to 0.05 μm and 0.2 μm. They all turn out to be almost same as the data in FIG. 9. From these results it is sufficient only to form a quite thin surface region 43 in a channel region 42a, since the minimum thickness of the region made by doping such as ion implantation is about 0.05 μm and the noise performance does not depend on the thickness of the surface region between 0.05 μm and 0.2 μm.

The surface region 43 is formed so thin that it does not affect other DC characteristics such as $g_{mo}$ and $I_{DSS}$ of the J-FET except $V_p$. They are determined by the condition of the channel formation steps and it is possible to keep the deviation of the device characteristics for a single lot in a sufficiently narrow allowable range.

Figure 10:
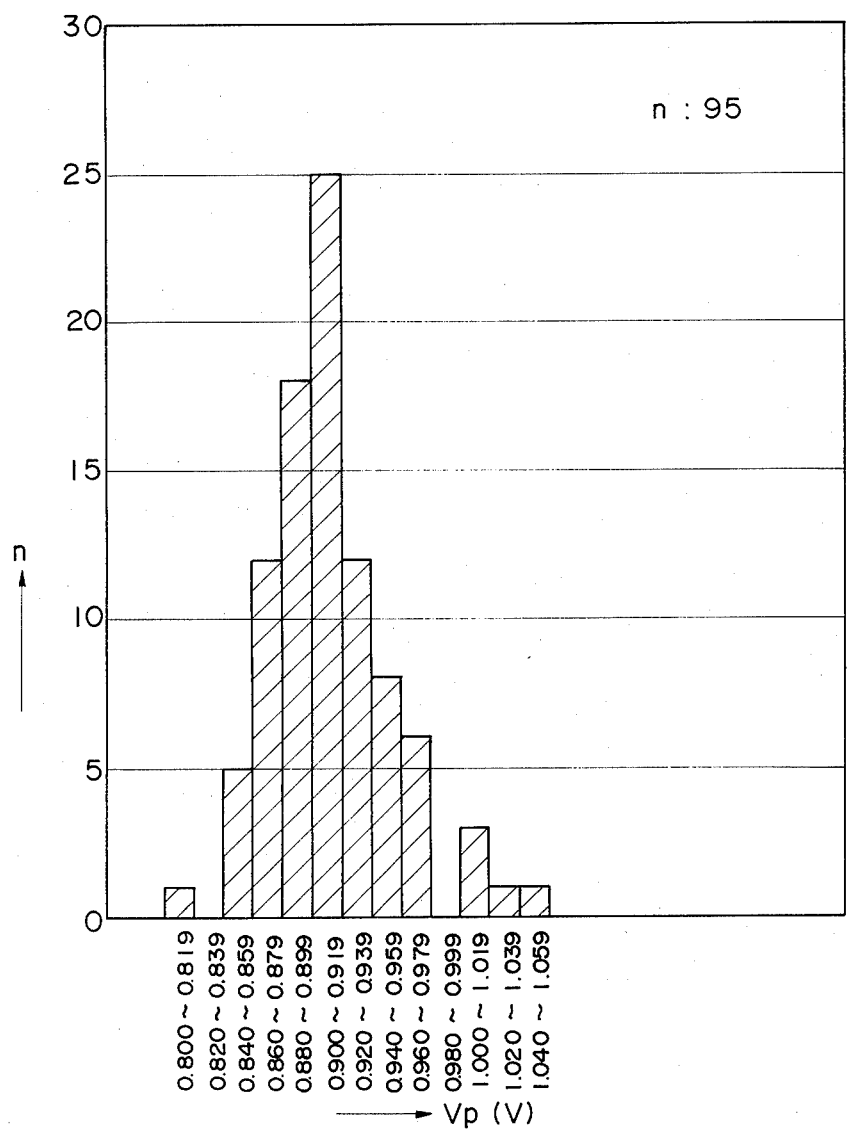
FIG. 10, FIG. 11 and FIG. 12 are histograms showing the variation of DC characteristics of J-FETs in accordance with the present invention.
Figure 11:
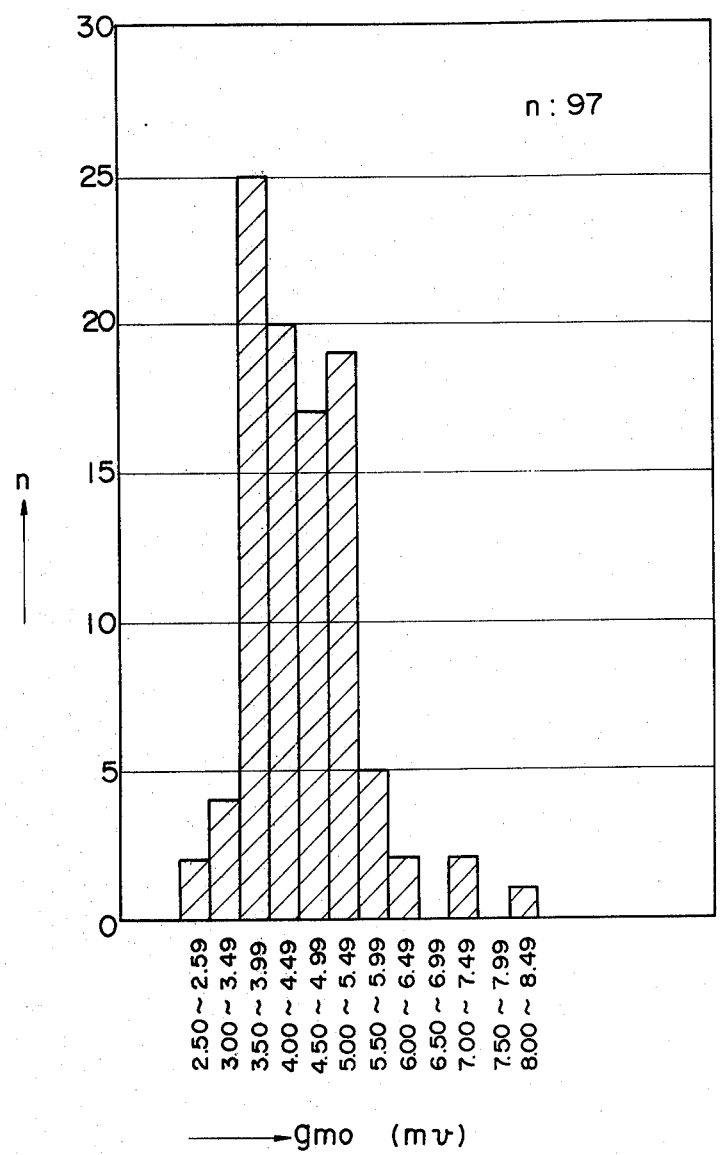
Figure 12:
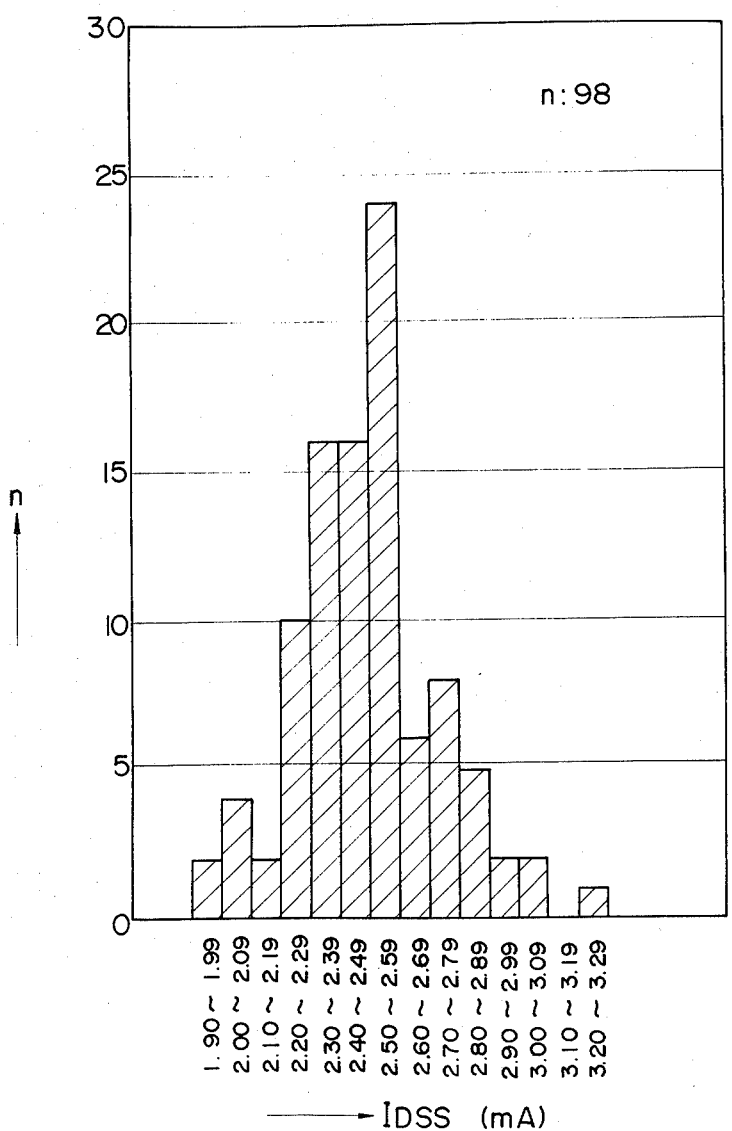

FIG. 10, FIG. 11 and FIG. 12 show histograms for the pinch off voltage $V_P$, the transconductance $g_{mo}$, the drain saturation current $I_{DSS}$ for the J-FET's in accordance with the present invention, respectively. The diagrams are obtained for specified number of the devices, whose number is designated by n. It turns out that the deviation for $V_P$ is within 6.8%, for $g_{mo}$ 20.0% and $I_{DSS}$ 9.7%. These values lie within the usual standard deviation of 10–30%.

Figure 13:
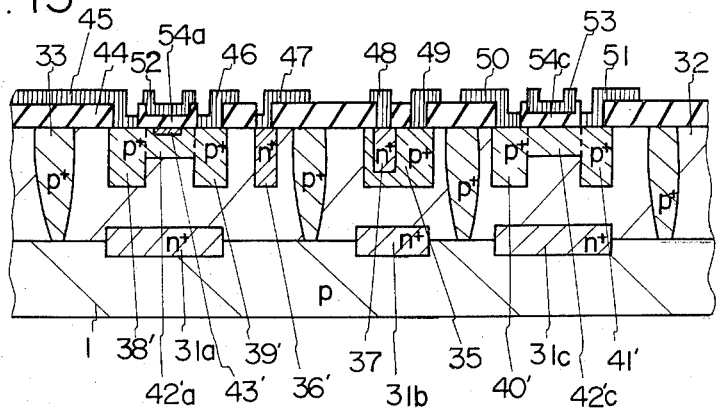
FIG. 13 is a sectional elevation view of an IC in accordance with another embodiment of the present invention.

FIG. 13 shows an IC device, wherein the conductivity type of the channel for a J-FET and the resistor region is opposite to that of the IC device in FIG. 5. Similar superior characteristics are also obtainable for this device. The IC device does not have p-type wells 34a and 34c, but a p-type channel 42'a and a p-type resistor region 42'c are made in an n-type epitaxial layer 32 in a similar manner as the case of FIG. 5. In FIG. 13 numerals with primes are used to distinguish equivalent regions to that of FIG. 5, but of opposite conductivity types.

Figure 14:
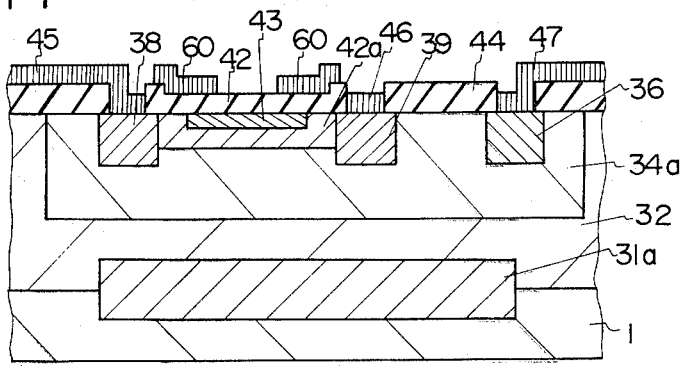
FIG. 14 and FIG. 15 are sectional views of still other embodiments in accordance with the present invention.

FIG. 14 shows another IC device of the present invention, wherein a metal gate electrode 60 is formed over a channel region 42a but except over a doped surface region 43 of island like geometry. Similar effect to the foregoing examples can be also expected for the device having this constitution.

Figure 15:
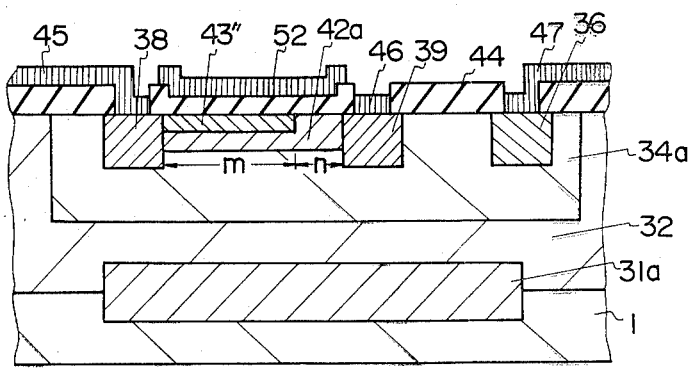

FIG. 15 shows still another embodiment, wherein an impurity doped surface region 43" of island like geometry has contact with the source 38 of a J-FET. In this case, channel length between the source 38 and the drain 39 is 7.5 μm, length m of the surface region 43 is 5 μm and distance n between the surface region 43 and the drain 39 is 2.5 μm. Other factors are same as the embodiment of FIG. 5, and almost same results as that of FIG. 5 are obtained for the frequency characteristics of noise. This embodiment has merit in that it is suitable for large scale integration, since the device dimension can be reduced by the distance between the source 38 and the surface region 43 of island like.

The present invention thus reduces surface noise so that the noise performance of the J-FET is superior. Furthermore, the present invention enables use of a low single-voltage source and provides a resistor element of good performance, with a bipolar transistor formed together with the J-FET on a single monolithic substrate. The present invention therefore largely contributes to realization of an IC device of high function performance.

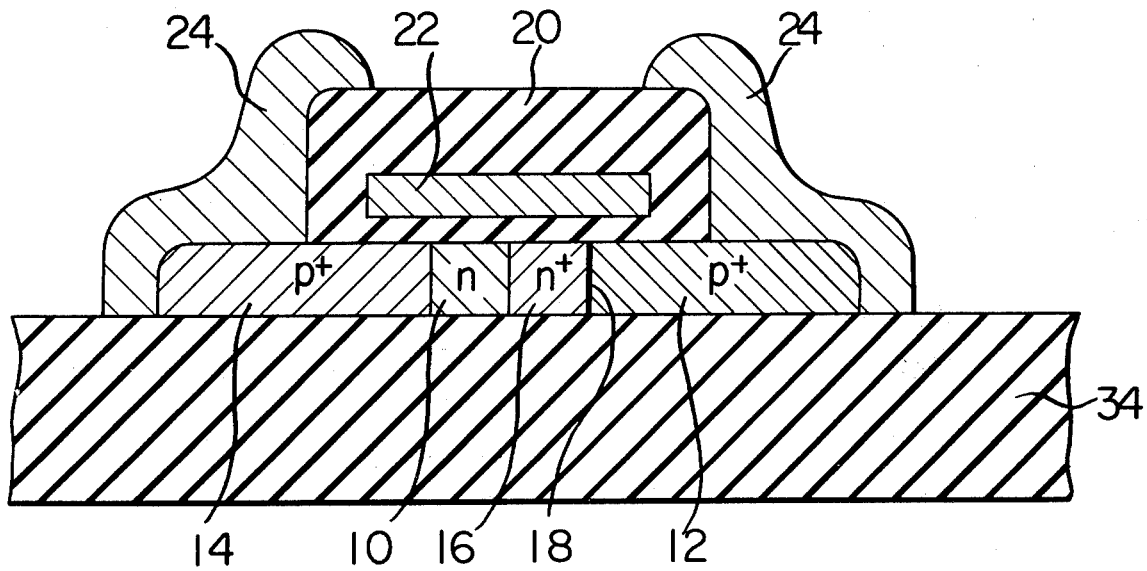

What is claimed is:

1. A semiconductor integrated circuit device having on a monolithic substrate:
   a junction-type field effect transistor comprising:
   a gate region of a first conductivity type,
   a source region and drain region which are both formed apart from each other in said gate region and of a second conductivity type that is opposite to said first conductivity type,
   a surface channel region of said second conductivity type and lower resistivity, and formed shallower than said source region and said drain region in a manner to connect said source region and said drain region,
   an impurity doped surface region of said first conductivity type, higher impurity concentration and a shallower depth than said surface channel region and formed in said surface channel region apart at least from said drain region, and
   an insulating film completely covering said impurity doped surface region; and
   at least one other semiconductor device.

2. A semiconductor integrated circuit device in accordance with claim 1, wherein
   said at least one other semiconductor device comprises a resistor region having and the same depth and impurity concentration as said surface channel region.

3. A semiconductor integrated circuit device in accordance with claim 1, wherein
   said impurity doped surface region contacts and is electrically connected with said gate region.

4. A semiconductor integrated circuit device in accordance with claim 1, further comprising
   a metal gate electrode disposed over said surface channel region with said insulating film disposed inbetween.

5. A semiconductor integrated circuit device in accordance with claim 1, wherein
   said impurity doped surface region contacts and is electrically connected with said source region.

6. A semiconductor integrated circuit device in accordance with claim 1, wherein
   a first well is formed to surround said gate region and a second well is formed surrounding said one other semiconductor device, said first and second wells having the conductivity type opposite to that of said gate region.

7. A semiconductor integrated circuit device in accordance with claim 1, further comprising
   a metal gate electrode at least partly disposed over said surface channel region with said insulating film in between but excluding a part over said impurity doped surface region.

8. A semiconductor integrated circuit device in accordance with claim 2, further comprising
   an electrode disposed over said resistor region with an insulating film inbetween.

9. A semiconductor integrated circuit device in accordance with claim 2, wherein
   said surface channel region and said resistor region are of n-type and formed in a p-type well.

10. A semiconductor integrated circuit device having on a monolithic substrate:
    a junction-type field effect transistor comprising:
    a gate region of a first conductivity type,
    a source region and a drain region which are both formed apart from each other in said gate region and of a second conductivity type that is opposite to said first conductivity type,
    a surface channel region of said second conductivity type and lower resistivity and formed shallower than said source region and said drain region in a manner to connect said source region and said drain region,
    an impurity doped surface region of said first conductivity type, higher impurity concentration and a shallower depth than said surface channel region and being formed in said surface channel region apart at least from said drain region, and
    an insulating film completely covering said impurity doped surface region;
    a bipolar transistor; and
    a resistor region formed simultaneously with said surface channel region, having the same depth and impurity concentration as said surface channel region.

11. A semiconductor integrated circuit device having on a monolithic substrate:
  a junction-type field effect transistor comprising:
    a gate region of a first conductivity type,
    a source region and a drain region which are both formed apart from each other in said gate region and of a second conductivity type that is opposite to said first conductivity type,
    a surface channel region of said second conductivity type and lower resistivity and formed shallower than said source region and said drain region in a manner to connect said source region and said drain region,
    an impurity doped surface region of said first conductivity type, higher impurity concentration and a shallower depth than said surface channel region, formed in said surface channel region apart at least from said drain region,
    an insulating film completely covering said impurity doped surface region, and
    a metal gate electrode disposed over said surface channel region with said insulating film in between for inducing minority carriers of said first conductivity type around said impurity doped surface region; and
  at least one other semiconductor device.

12. A semiconductor integrated circuit device in accordance with claim 11, wherein
  said at least one other semiconductor device comprises a resistor region having the same depth and impurity concentration as said surface channel region.

13. A semiconductor integrated circuit device in accordance with claim 11, wherein
  said impurity doped surface region contacts and is electrically connected with said gate region.

14. A semiconductor integrated circuit device in accordance with claim 11, wherein
  said impurity doped surface region contacts and is electrically connected with said source region.

15. A semiconductor integrated circuit device in accordance with claim 11, wherein
  a first well is formed surrounding said gate region and a second well is formed surrounding said at least one other semiconductor device, said first and second wells having the conductivity type opposite to that of said gate region.

16. A semiconductor integrated circuit device in accordance with claim 11, wherein
  said metal gate electrode is at least partly disposed over said surface channel region with said insulating film in between, but excluding a part over said impurity doped surface region.

17. A semiconductor integrated circuit device in accordance with claim 12, further comprising:
  an insulating film completely covering said resistor region;
  an electrode disposed over said resistor region said insulating film.

18. A semiconductor integrated circuit device in accordance with claim 12, wherein
  said surface channel region and said resistor region are of n-type and formed in a p-type well.

19. A semiconductor integrated circuit device having on a monolithic substrate:
  a junction-type field effect transistor comprising:
    a gate region of a first conductivity type,
    a source region and a drain region which are both formed apart from each other in said gate region and of a second conductivity type that is opposite to said first conductivity type,
    a surface channel region of said second conductivity type, lower resistivity and formed shallower than said source region and said drain region in a manner to connect said source region and said drain region,
    an impurity doped surface region of said first conductivity type, higher impurity concentration and a shallower depth than said surface channel region formed in said surface channel region apart at least from said drain region,
    an insulating film completely covering said impurity doped surface region, and
    a metal gate electrode disposed over said surface channel region with said insulating film in between for inducing minority carriers of said first conductivity type around said impurity doped surface region;
  a bipolar transistor; and
  a resistor region which is formed simultaneously with the forming of said surface channel region and is of the same depth and impurity concentration as said surface channel region.

20. A semiconductor integrated circuit device in accordance with claim 19, wherein
  said impurity doped surface region contacts and is electrically connected with said gate region.

21. A semiconductor integrated circuit device in accordance with claim 19, wherein
  said impurity doped surface regio contacts and is electrically connected with said source region.

22. A semiconductor integrated circuit device in accordance with claim 19, wherein
  a first well is formed surrounding said gate region and a second well is formed surrounding said at least one other semiconductor device, said first and second wells having a conductivity type opposite to that of said gate region.

23. A semiconductor integrated circuit device in accordance with claim 19, wherein
  said metal gate electrode is at least partly disposed over said surface channel region with said insulating film in between, but excluding a part over said impurity doped surface region.

24. A semiconductor integrated circuit device in accordance with claim 19, wherein
  an electrode is disposed over said resistor region with an insulating film in between.

25. A semiconductor integrated circuit device in accordance with claim 19, wherein
  said surface channel region and said resistor region are of n-type and formed in a p-type well.

* * * * *

United States Patent [19]

Kyomasu et al.

[11] 4,233,616
[45] Nov. 11, 1980

[54] SEMICONDUCTOR NON-VOLATILE MEMORY

[75] Inventors: Mikio Kyomasu; Yoshiharu Nakao, both of Itami, Japan

[73] Assignee: Mitsubishi Denki Kabushiki Kaisha, Tokyo, Japan

[21] Appl. No.: 910,950

[22] Filed: May 30, 1978

[30] Foreign Application Priority Data

Jun. 8, 1977 [JP] Japan ................................ 52-68217

[51] Int. Cl.$^2$ ............................................. H01L 29/78
[52] U.S. Cl. .......................................... 357/23; 357/13; 357/4
[58] Field of Search ......................... 357/23, 41, 13, 4

[56] References Cited
U.S. PATENT DOCUMENTS

| | | | |
|---|---|---|---|
| 4,014,036 | 3/1977 | Ho | 357/24 |
| 4,054,895 | 10/1977 | Ham | 357/23 |
| 4,057,820 | 11/1977 | Gallagher | 357/23 |
| 4,135,929 | 1/1979 | Breus | 29/571 |
| 4,142,926 | 3/1979 | Morgan | 148/187 |

*Primary Examiner*—Martin H. Edlow
*Attorney, Agent, or Firm*—Wenderoth, Lind & Ponack

[57] ABSTRACT

In the disclosed FAMOS semiconductor non-volatile memory a source and a drain region of the p$^+$ type are disposed in an n semiconductor layer to form a gate region between them. The main face of the semiconductor layer is coated with a silicon dioxide film in which a polycrystalline silicon gate is buried to bridge the source and drain regions. An n+ type high doped semiconductor region is disposed in the semiconductor layer only under the silicon gate to form a pn junction with the drain region. Thus the pn junction is normal to the main face of the semiconductor layer.

6 Claims, 3 Drawing Figures